(12) United States Patent
Tombak

(10) Patent No.: US 8,818,302 B2
(45) Date of Patent: Aug. 26, 2014

(54) HARMONIC TRAP CIRCUIT FOR LINEAR DIFFERENTIAL POWER AMPLIFIERS

(71) Applicant: RF Micro Devices, Inc., Greensboro, NC (US)

(72) Inventor: Ali Tombak, High Point, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/688,344

(22) Filed: Nov. 29, 2012

(65) Prior Publication Data

US 2013/0331048 A1    Dec. 12, 2013

Related U.S. Application Data

(60) Provisional application No. 61/642,143, filed on May 3, 2012.

(51) Int. Cl.
*H04B 1/04* (2006.01)
*H03F 3/45* (2006.01)

(52) U.S. Cl.
USPC ........................................ 455/114.1; 330/252

(58) Field of Classification Search
USPC ............. 455/95, 114.2, 120, 124, 127.1, 129; 330/195, 252–261, 296, 302
See application file for complete search history.

(56) References Cited

U.S. PATENT DOCUMENTS 7,860,454 B2 * 12/2010 Moloudi et al. ................ 455/20
2011/0003566 A1 * 1/2011 Makihara et al. .......... 455/127.1

OTHER PUBLICATIONS

Jongchan Kang et al. IEEE Journal of Solid State Circuits, vol. 41, No. 6, Jun. 2006.*
Kang et al., "A Highly Linear and Efficient Differential CMOS Power Amplifier with Harmonic Control", IEEE Journal of Solid-State Circuits, Jun. 2006, pp. 1314-1322, vol. 41, No. 6, Seoul, Korea.
Khan et al., "Study on Load Transformation Networks for Differential Common Drain Class-B RF Power Amplifier", IEEE, 2011, pp. 1-4, Aachen, Germany.

* cited by examiner

*Primary Examiner* — Blane J Jackson
(74) *Attorney, Agent, or Firm* — Withrow & Terranova, P.L.L.C.

(57) ABSTRACT

Tank circuitry coupled to the output terminals of a differential power amplifier includes two trap circuits configured to divert harmonic signals away from the output terminals. A tank inductor is provided to form a tank circuit in conjunction with each one of the trap circuits. At certain harmonic frequencies of the input signal to the differential power amplifier, the trap circuits are resonant and present a substantially low impedance path to ground, thereby diverting harmonic signals away from the output terminals of the differential power amplifier. At the fundamental frequency of the input signal to the differential power amplifier, the trap circuits are resonant with the tank inductor and present a substantially high impedance compared to the load impedance presented at the output terminals of the differential power amplifier, thereby reducing the loading effect of the trap circuits at the fundamental frequency.

44 Claims, 9 Drawing Sheets

HARMONIC TRAP CIRCUIT FOR LINEAR DIFFERENTIAL POWER AMPLIFIERS

RELATED APPLICATIONS

This application claims the benefit of provisional patent application Ser. No. 61/642,143, filed May 3, 2012, the disclosure of which is hereby incorporated by reference in its entirety.

FIELD OF THE DISCLOSURE

The present disclosure relates to high-efficiency, linear differential power amplifiers capable of operating over a wide bandwidth, and in particular to improving the performance of a differential power amplifier using harmonic trap circuitry.

BACKGROUND OF THE DISCLOSURE

Modern mobile communications devices often require power amplifiers capable of producing a linear output over a wide frequency band while maintaining a high level of efficiency. One way to improve the efficiency of a power amplifier is to bias the amplifier such that it remains off or partially off until a signal is received at the input of the amplifier. However, operating an amplifier in this manner often leads to undesirable signal components generated at the harmonic frequencies of the input signal. These harmonic signals may disturb the linearity of the amplifier or result in other undesirable distortion at the output of the amplifier.

Differential power amplifiers have been designed using harmonic trap circuitry to suppress the presence of harmonic signals at the output. Due to the wide bandwidth operating conditions of many power amplifiers, this trap circuitry must be designed to compensate for harmonic signals encompassing a wide frequency band. Although effective, trap circuitry designed in this manner exhibits a high amount of capacitive loading at the fundamental frequency of the input signal to the differential power amplifier. The capacitive loading at the fundamental frequency degrades the efficiency of the power amplifier, leading to sub-optimal performance. Further, the capacitive loading may lead to unrealistic or undesirable design constraints on the output matching network of the power amplifier. Accordingly, there is a need for a highly efficient, linear differential power amplifier that is capable of operating over a wide bandwidth while suppressing harmonic signals and avoiding the negative effects of capacitive loading.

SUMMARY OF THE DISCLOSURE

The present disclosure is related to high efficiency, linear differential power amplifiers capable of operating over a wide bandwidth. Tank circuitry coupled to the outputs of the differential power amplifier includes two trap circuits configured to divert harmonic signals away from the output. A tank inductor is provided to form a tank circuit in conjunction with each one of the trap circuits and reduce the loading effects of the trap circuits at the fundamental frequency. Each trap circuit is coupled between one of the output terminals of the differential power amplifier and ground. The tank inductor is coupled between the output terminals of the differential power amplifier. At certain harmonic frequencies of the input signal to the differential power amplifier, the trap circuits are resonant and present a substantially low impedance path to ground, thereby diverting harmonic signals away from the output terminals of the differential power amplifier. At the fundamental frequency of the input signal to the differential power amplifier, the trap circuits are resonant with the tank inductor and present a substantially high impedance compared to the load impedance presented at the output terminals of the differential power amplifier, thereby reducing the loading effect of the trap circuits at the fundamental frequency. Accordingly, a differential power amplifier is produced that is highly efficient and linear with a wide bandwidth of operation, and further allows for realistic design values of an output matching network.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice embodiments of the disclosure and illustrate the best mode of practicing the principles of the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
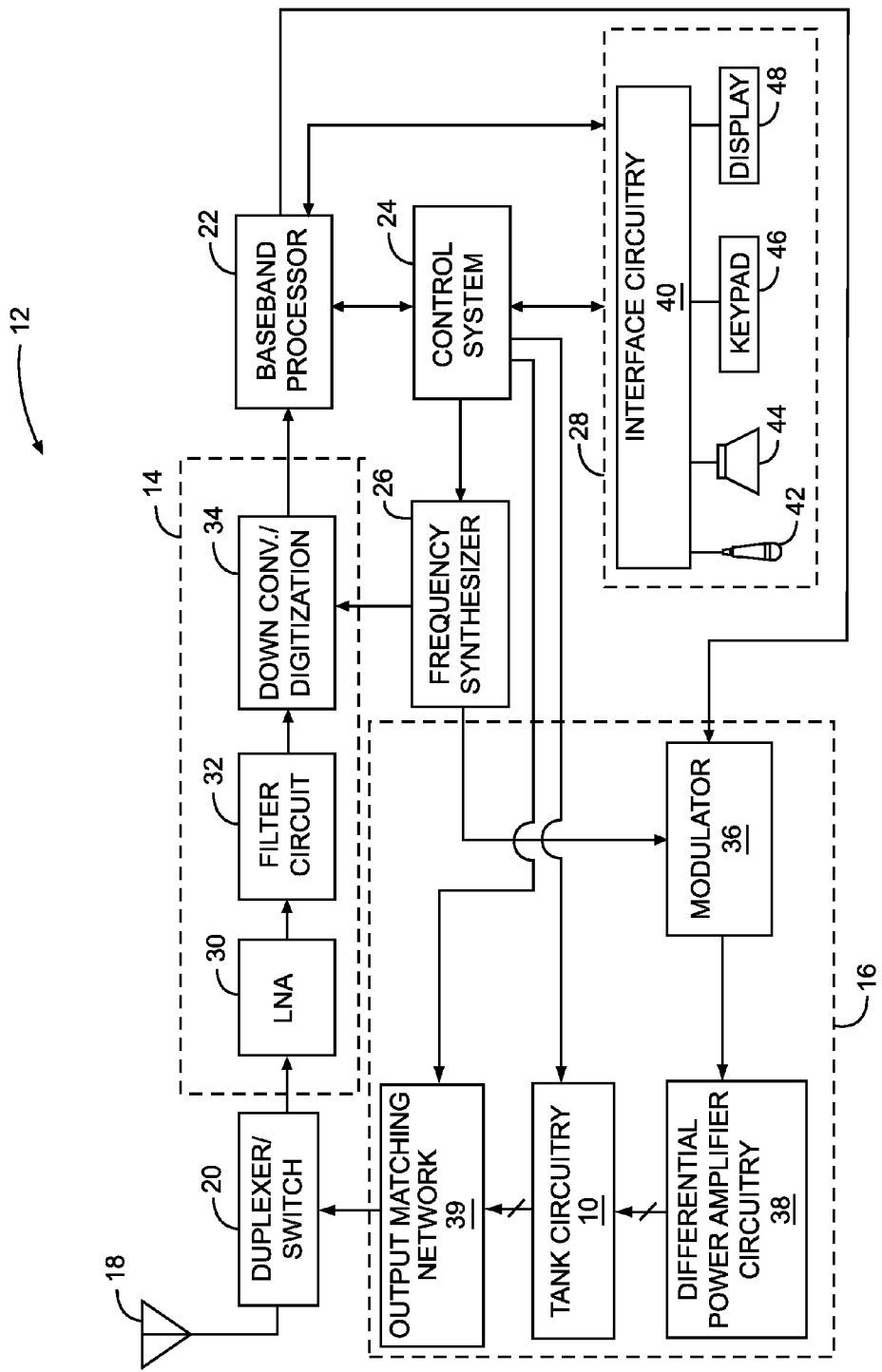
FIG. 1 is a schematic representation of a mobile terminal according to the present disclosure.

Turning now to FIG. 1, a first embodiment of tank circuitry 10 according to the present disclosure is incorporated into a mobile terminal 12, such as a mobile telephone, a personal digital assistant, or the like. The basic architecture of the mobile terminal 12 may include a receiver front end 14, a radio frequency transmitter section 16, an antenna 18, a duplexer or switch 20, a baseband processor 22, a control system 24, a frequency synthesizer 26, and an interface 28. The receiver front end 14 receives information bearing radio frequency signals from one or more remote transmitters provided by a base station (not shown). A low noise amplifier (LNA) 30 amplifies the signal. A filtering circuit 32 minimizes broadband interference in the received signal, while down conversion and digitization circuitry 34 down converts the filtered, received signal to an intermediate or baseband frequency signal, which is then digitized into one or more digital streams. The receiver front end 14 typically uses one or more mixing frequencies generated by the frequency synthesizer 26. The baseband processor 22 processes the digitized received signal to extract the information or data bits conveyed in the received signal. This processing typically comprises demodulation, decoding, and error correction operations. Accordingly, the baseband processor 22 is generally implemented in one or more digital signal processors (DSPs).

On the transmit side, the baseband processor 22 receives digitized data, which may represent voice, data, or control information, from the control system 24, which encodes it for transmission. The encoded data is output to the radio frequency transmitter section 16, where it is used by a modulator 36 to modulate a carrier signal at a desired transmit frequency. Differential power amplifier circuitry 38 amplifies the modulated carrier signal to a level appropriate for transmission, and delivers the differential signal to the tank circuitry 10. As discussed in greater detail below, the tank circuitry 10 processes the differential signal to reduce undesirable signal components produced by the differential power amplifier circuitry 38 and delivers the processed signal to the antenna 18 through an output matching network 39 and the duplexer or switch 20. The output matching network 39 is designed to match the impedance of the antenna 18 and the duplexer or switch 20 at the output terminals of the differential power amplifier circuitry 38. According to some embodiments of the present disclosure, the control system 24 may be in communication with the tank circuitry 10 and the output matching network 39 in order to monitor or control one or more operating parameters of the differential power amplifier circuitry 38.

A user may interact with the mobile terminal 12 via the interface 28, which may include interface circuitry 40 associated with a microphone 42, a speaker 44, a keypad 46, and a display 48. The interface circuitry 40 typically includes analog-to-digital converters, digital-to-analog converters, amplifiers, and the like. Additionally, it may include a voice encoder/decoder, in which case it may communicate directly with the baseband processor 22. The microphone 42 will typically convert audio input, such as the user's voice, into an electrical signal, which is then digitized and passed directly or indirectly to the baseband processor 22. Audio information encoded in the received signal is recovered by the baseband processor 22, and converted by the interface circuitry 40 into an analog signal suitable for driving the speaker 44. The keypad 46 and the display 48 enable the user to interact with the mobile terminal 12, for example, by entering numbers to be dialed, accessing address book information, or the like.

Figure 2:
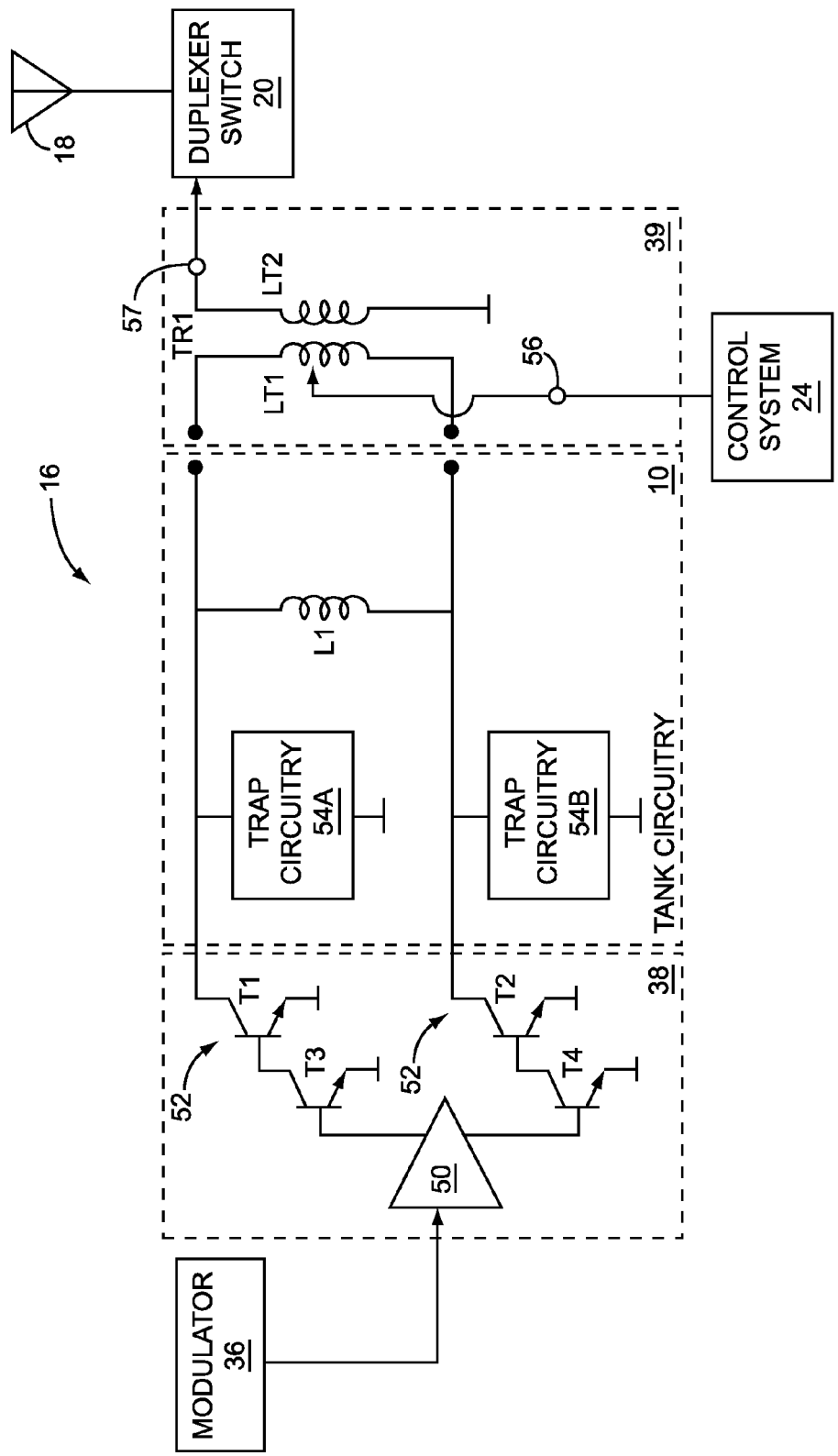
FIG. 2 is a schematic representation of a mobile terminal transmitter according to the present disclosure.

FIG. 2 is a schematic representation of the radio frequency transmitter section 16 according to one embodiment of the present disclosure. The radio frequency transmitter section 16 includes the modulator 36, the differential power amplifier circuitry 38, the tank circuitry 10, and the output matching network 39. For context, the antenna 18, the duplexer or switch 20, and the control system 24 are also illustrated. As discussed above, when the mobile terminal 12 of FIG. 1 is ready to transmit a signal, encoded data is sent to the modulator 36. The modulator 36 modulates a carrier signal at the desired frequency, and delivers the modulated signal to the differential power amplifier circuitry 38. The differential power amplifier circuitry 38 amplifies the modulated carrier signal to a level appropriate for transmission. In amplifying the modulated carrier signal to provide the differential signal, the differential power amplifier circuitry 38 may produce undesirable signal components within the differential signal. Accordingly, the tank circuitry 10 is provided to reduce or suppress these undesirable signal components presented in the differential signal. Once the tank circuitry 10 has appropriately processed the differential signal, the processed signal is delivered to the antenna 18 through the output matching network 39 and the duplexer or switch 20.

The differential power amplifier circuitry 38 may include an input stage 50 and one or more differential output stages 52. The input stage 50 may be configured to accept a single-ended input signal and produce a differential output signal. In some embodiments, the differential power amplifier circuitry 38 does not include the input stage 50, and instead accepts a differential input signal directly from the modulator 36. The one or more differential output stages 52 may include, for example, one or more differential transistor pairs T1-T4.

The mobile terminal 12 may require a power amplifier capable of producing a linear output over a wide frequency band while maintaining a high level of efficiency. One way to improve the efficiency of a power amplifier is to bias the amplifier such that the amplifier remains off or partially off until a signal is received at the input of the amplifier, such as in class B or class AB biasing schemes. Accordingly, in some embodiments, the differential power amplifier circuitry 38 may be biased as a class B or class AB amplifier. Although operating the differential power amplifier circuitry 38 in this manner results in a high level of efficiency, the performance of the amplifier is degraded due to harmonic signals generated by the amplifier within the differential signal.

The primary or carrier frequency of the input signal presented to the differential power amplifier circuitry 38 is known as the fundamental frequency. Frequencies occurring at integer multiples of the fundamental frequency are known as harmonic frequencies. For example, the second harmonic frequency of a signal is two times its fundamental frequency. Harmonic signals are signals occurring at one or more harmonic frequencies, and may be generated by the differential power amplifier circuitry 38 due to non-linearity of the device or by the modulator 36 during modulation of the signal. The harmonic signals increase as the amplifier is operated from a class A biasing scheme to a class C biasing scheme.

The tank circuitry 10 is provided to reduce undesirable harmonic signals in the differential signal while maintaining the efficiency and linearity of the differential power amplifier circuitry 38. The tank circuitry 10 may include two or more trap circuits 54 and a tank inductor L1. According to some embodiments of the present disclosure, the tank circuitry 10 may further include a bias input terminal 56. The trap circuits 54 are each coupled between one of the outputs of the differential power amplifier circuitry 38 and ground. The trap circuits 54 may be configured to resonate at one or more harmonic frequencies expected to appear in the differential signal. When the trap circuits 54 are resonant, they form a substantially low impedance path to ground. Accordingly, because the trap circuits 54 are configured to resonate at one or more harmonic frequencies of the differential signal, portions of the differential signal about the selected harmonics will flow through the trap circuits 54 to ground, and will not generate a harmonic voltage at the output terminals of the differential power amplifier circuitry 38.

Although effective at reducing harmonic signals in the differential signal, the trap circuits 54 may introduce an undesirable capacitive loading to the output terminals of the differential power amplifier circuitry 38 at the fundamental frequency of the differential signal. Accordingly, the tank inductor L1 is coupled across the respective outputs of the differential power amplifier circuitry 38 to reduce the capacitive loading of the trap circuits 54 at the fundamental frequency of the differential signal. The tank inductor L1 is chosen such that it is resonant with each one of the trap circuits 54 at the fundamental frequency of the differential signal. When the trap circuits 54 are resonant with the tank inductor L1, a substantially high impedance path is formed between each output terminal of the differential power amplifier circuitry 38 and ground. Accordingly, the loading effects of the trap circuits 54 are reduced at the fundamental frequency of the differential signal.

The output matching network 39 receives the differential signal, in which the selected harmonics have been attenuated, and produces a single-ended output signal, which is sent to the antenna 18 through the duplexer or switch 20. According to some embodiments, the output matching network 39 may include a transformer TR1 with a first transforming inductor LT1 connected between the output terminals of the differential power amplifier circuitry 38 and a second transforming inductor LT2 coupled between ground and a single-ended output terminal 57. The first transforming inductor LT1 and the second transforming inductor LT2 may be electromagnetically coupled such that a current flowing through the first transforming inductor LT1 will induce a proportional current in the second transforming inductor LT2. In another embodiment, the output matching network 39 may include a balanced to unbalanced (balun) transformer.

The bias input terminal 56 may be connected to the midpoint of the first transforming inductor LT1 and configured to provide a biasing signal through the transformer TR1 to the differential power amplifier circuitry 38 in order to set the operating conditions of the device. According to some embodiments of the present disclosure, the bias input terminal 56 may be in communication with the control system 24. The control system 24 may be configured to provide a biasing signal to the bias input terminal 56 in order to set the operating conditions of the differential power amplifier circuitry 38.

Figure 3:
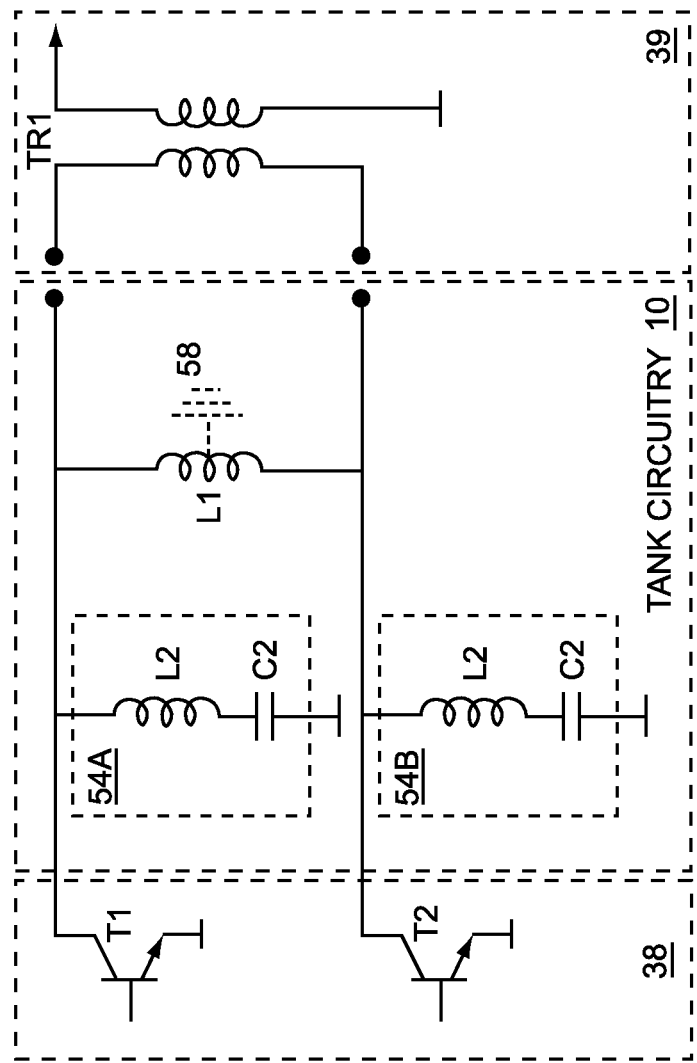
FIG. 3 is a detailed schematic representation of a tank circuit according to the present disclosure.

FIG. 3 is a detailed schematic representation of the tank circuitry 10 according to one embodiment of the present disclosure. For context, the differential power amplifier circuitry 38 and the output matching network 39 are also shown. The tank circuitry 10 may include two or more trap circuits 54, a tank inductor L1, and a virtual ground 58. The tank circuitry 10 may be connected to the output of the differential power amplifier circuitry 38. The trap circuits 54 may include a trap inductor L2 and a trap capacitor C2 coupled between one of the outputs of the differential power amplifier circuitry 38 and ground. The values of the trap inductor L2 and the trap capacitor C2 may be chosen such that the trap circuits 54 are resonant at one or more harmonic frequencies of the differential signal. For example, the trap circuits 54 may be designed to resonate at the second harmonic of the differential signal. Equation 1 represents the design conditions for the trap circuits 54 to resonate at the second harmonic of the differential signal:

$$(2*\omega_0)^2 * L2 * C2 = 1 \qquad (1)$$

Where $\omega_0$ is the fundamental frequency of the differential signal. Choosing values for the trap inductor L2 and the trap capacitor C2 that satisfy the conditions of Equation 1 will produce a trap circuit that is resonant at the second harmonic of the differential signal. When the trap inductor L2 and the trap capacitor C2 are resonant, they provide a substantially low impedance path across both the trap inductor L2 and the trap capacitor C2, thereby forming a shunt path from each of the output terminals of the differential power amplifier circuitry 38 to ground. Accordingly, signals about the second harmonic of the differential signal pass through the trap circuits 54 to ground, and do not generate a harmonic voltage at the output terminals of the differential power amplifier circuitry 38. By designing the trap circuits 54 in this manner, the linearity of the differential power amplifier circuitry 38 is improved and harmonic signals in the differential signal are reduced or eliminated altogether.

While the trap circuits 54 are effective at improving linearity and reducing harmonic signals in the differential signal, they also introduce an undesirable capacitive loading at the fundamental frequency of the differential signal. Equation 2 represents the impedance of each one of the trap circuits 54 with respect to the frequency of a signal passing through the trap circuit:

$$X_{TC} = \frac{1}{j\omega C2} + j\omega L2 \qquad (2)$$

Where $X_{TC}$ is the impedance of each one of the trap circuits 54, and $\omega$ is the frequency of the signal passing through each one of the trap circuits 54. Equation 2 shows that as the frequency of the signal passing through each one of the trap circuits 54 decreases, the trap circuits 54 appear more capacitive and therefore present a substantial amount of loading at the output of the differential power amplifier circuitry 38 at the fundamental frequency.

Due to the wide operating bandwidth requirements of many power amplifiers, the capacitive loading presented by the trap circuits 54 may be further increased. As the operating frequency band of the differential power amplifier circuitry 38 is increased, the frequency band of the harmonic signals produced in the differential signal is proportionally increased. Accordingly, the trap circuits 54 must be designed to reduce harmonic signals that span across a wide frequency band. This results in designing higher capacitance values for the trap capacitor C2, thereby further increasing the capacitive loading seen at the output of the differential power amplifier circuitry 38 at the fundamental frequency of the differential signal.

The capacitive loading introduced by the trap circuits 54 may severely degrade the performance of the differential power amplifier circuitry 38, resulting in a loss of both efficiency and linearity. Further, the capacitive loading may result in unrealistic design constraints on the output matching network 39. As discussed above, the output matching network 39 is designed to match the impedance of a connected load. The high capacitive loading, and therefore low impedance, across the trap circuits 54 at the fundamental frequency may cause an impedance transformation of the output matching network 39, resulting in unrealistic or undesirable design constraints when the designer wishes to match the impedance of a connected load.

The tank inductor L1 is provided to reduce the loading presented by the trap circuits 54 at the output of the differential power amplifier circuitry 38. Because the tank inductor L1 is connected between the output terminals of the differential power amplifier circuitry 38, the voltage presented at each terminal of the tank inductor L1 will be equal but opposite in phase. Accordingly, the voltage at the midpoint of the tank inductor L1 will hold steady at zero, resulting in the virtual ground 58 at this point. By designing the tank inductor L1 so that the half of the inductor presented before the virtual ground 58 to each output terminal of the differential power amplifier circuitry 38 resonates with the trap circuit coupled to the same output terminal at the fundamental frequency of the differential signal, the effects of the capacitive loading presented by trap circuits 54 can be reduced or eliminated. Equation 3 represents the design conditions for the tank inductor L1 and the trap circuits 54 to resonate at the fundamental frequency of the differential signal:

$$\omega_0 * \left(\frac{L1}{2}\right) + \omega_0 * L2 - \frac{1}{\omega_0 * C2} = 0 \qquad (3)$$

Where $\omega_0$ is the fundamental frequency of the differential signal. By choosing value for the tank inductor L1, the trap inductor L2, and the trap capacitor C2 to satisfy the conditions of Equation 3, the tank inductor L1, the trap inductor L2, and the trap capacitor C2 will resonate together at the fundamental frequency of the differential signal. When the tank inductor L1, the trap inductor L2, and the trap capacitor C2 are resonant, they present a substantially high impedance path to the output terminals of the differential power amplifier circuitry 38 in comparison to the load impedance of the output matching network 39. Accordingly, the loading effects of the trap circuits 54 are reduced, and the impedance of the output matching network 39 network does not experience an impedance transformation from the trap circuits 54.

By choosing the values of the tank inductor L1, the trap inductor L2, and the trap capacitor C2 such that the conditions of both Equation 1 and Equation 2 are satisfied, the trap inductor L2 and the trap capacitor C2 will resonate at the second harmonic of the differential signal to form a trap circuit, while the tank inductor L1, the trap inductor L2, and the trap capacitor C2 will resonate at the fundamental frequency of the differential signal to form a tank circuit. Accordingly, at the second harmonic frequency of the differential signal the trap inductor L2 and the trap capacitor C2 present a substantially low impedance path to ground, thereby reducing or eliminating signals about the second harmonic of the differential signal. At the fundamental frequency of the differential signal, the tank inductor L1, the trap inductor L2, and the trap capacitor C2 present a substantially high impedance path to the output terminals of the differential power amplifier circuitry 38 compared to the output matching network 59, thereby reducing the loading effects of the trap circuits 54.

In an alternative embodiment, the value of the tank inductor L1 may be designed such that the tank inductor L1 does not resonate with the trap circuits 54 at the fundamental frequency of the differential signal, but instead pre-matches the loading impedance presented by the trap circuits 54. Equation 4 represents the design conditions for the tank inductor L1 to pre-match the loading impedance of the trap circuits 54:

$$L1 < \left(\frac{2}{\omega_0}\right) * \left(-\omega_0 * L2 + \frac{1}{\omega_0 * C2}\right) \qquad (4)$$

Where $\omega_0$ is the fundamental frequency of the differential signal. By choosing the value of the tank inductor L1 to satisfy the conditions of Equation 4, the tank inductor L1 will pre-match the loading of the trap circuits 54 by presenting an inductive load at the output of the differential power amplifier circuitry 38 opposite the capacitive load provided by the trap circuits 54. Accordingly, the capacitive loading caused by the trap circuits 54 will be converted to inductive loading, resulting in realistic design constraints on the output matching network 39.

Figure 4A:
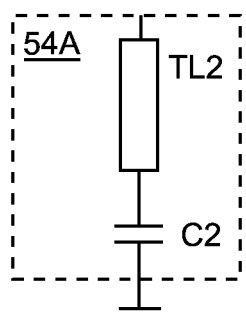
FIGS. 4A and 4B are detailed schematic representations of embodiments of a trap circuit according to the present disclosure.
Figure 4B:
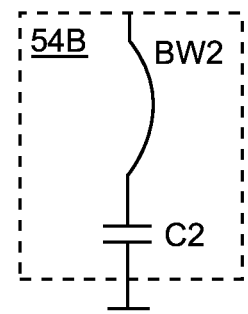

Although FIG. 3 shows the trap circuits 54 as containing the trap inductor L2 and the trap capacitor C2, the trap circuits 54 may include any number of components capable of resonating to produce a shunt path about a given frequency band. FIG. 4 shows two embodiments of the trap circuitry 54 in accordance with the present disclosure. FIG. 4A includes a trap transmission line TL2 and a trap capacitor C2. The trap transmission line TL2 is chosen to resonate with the trap capacitor C2 at one or more harmonic frequencies, as discussed in further detail below. FIG. 4B shows a trap bond wire BW2 and a trap capacitor C2. The trap bond wire BW2 is designed to resonate with the capacitor at one or more harmonic frequencies, as discussed in further detail below.

Figure 5:
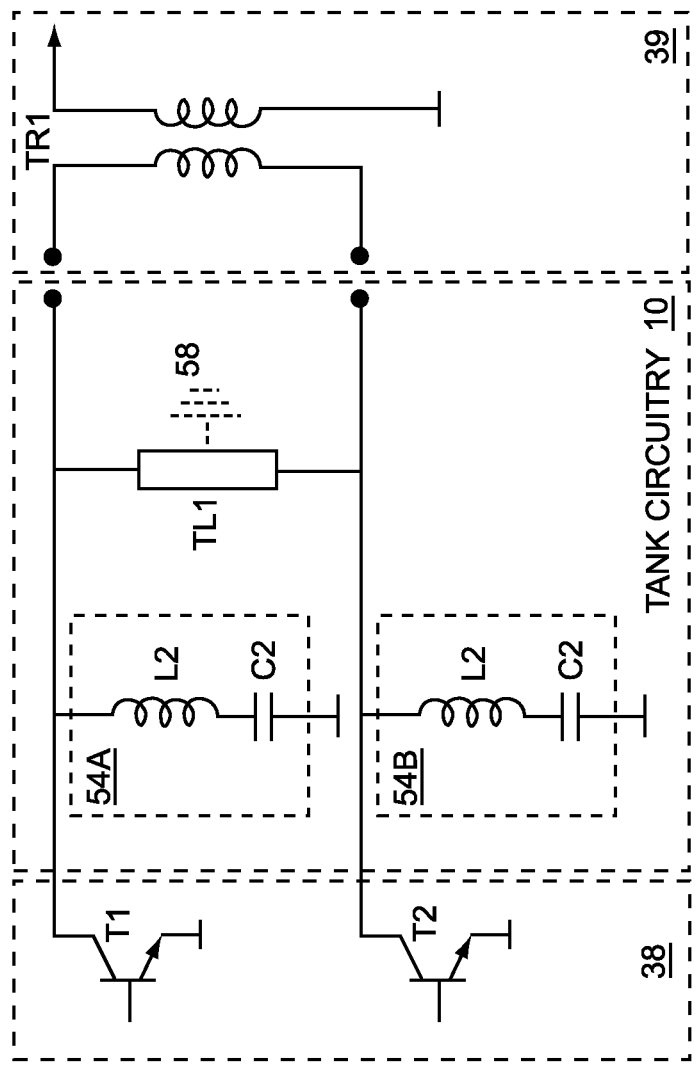
FIG. 5 is a detailed schematic representation of an embodiment of a tank circuit according to the present disclosure.

FIG. 5 shows a detailed schematic representation of an alternative embodiment of the tank circuitry 10 according to one embodiment of the present disclosure. For context, the differential power amplifier circuitry 38 and the output matching network 39 are also shown. According to this embodiment, the tank circuitry 10 may include two or more trap circuits 54, a tank transmission line TL1, and a virtual ground 58. The tank circuitry 10 may be connected to the output terminals of the differential power amplifier circuitry 38. Because the tank transmission line TL1 is connected between the output terminals of the differential power amplifier circuitry 38, the voltage presented at each terminal of the tank transmission line TL1 will be equal but opposite in phase. Accordingly, the voltage at the midpoint of the tank transmission line TL1 will hold steady at zero, resulting in the virtual ground 58 at this point. The half of the tank transmission line TL1 presented before the virtual ground 58 to each output terminal of the differential power amplifier circuitry 38 will appear as a short circuited stub at the fundamental frequency of the differential signal, and will perform as an inductor. By designing the tank transmission line TL1 such that the half of the transmission line presented before the virtual ground 58 to each output terminal of the differential power amplifier circuitry 38 resonates with the trap circuit coupled to the same output terminal at the fundamental frequency of the differential signal, the effects of the capacitive loading presented by the trap circuits 54 can be reduced or eliminated. Equation 5 represents the design conditions for the tank transmission line TL1 to resonate with the trap circuits 54 at the fundamental frequency of the differential signal:

$$Z_0 * \tan\left(\frac{\beta L}{2}\right) \leq \omega_0 * L1/2 \qquad (5)$$

Where $Z_0$ is the characteristic impedance of the tank transmission line TL1, $\beta$ is the propagation constant, L is the length of the tank transmission line TL1, and $\omega_0$ is the fundamental frequency of the differential signal. By choosing the length L of the tank transmission line TL1 to satisfy the conditions of Equation 5, the tank transmission line TL1 will resonate with the trap circuits 54 at the fundamental frequency of the differential signal, thereby presenting a substantially high impedance path to the output terminals of the differential power amplifier circuitry 38 in comparison to the load impedance of the output matching network 39. Accordingly, the loading effects of the trap circuits 54 are reduced, and the impedance of the output matching network 39 does not experience an impedance transformation from the trap circuits 54.

Figure 6:
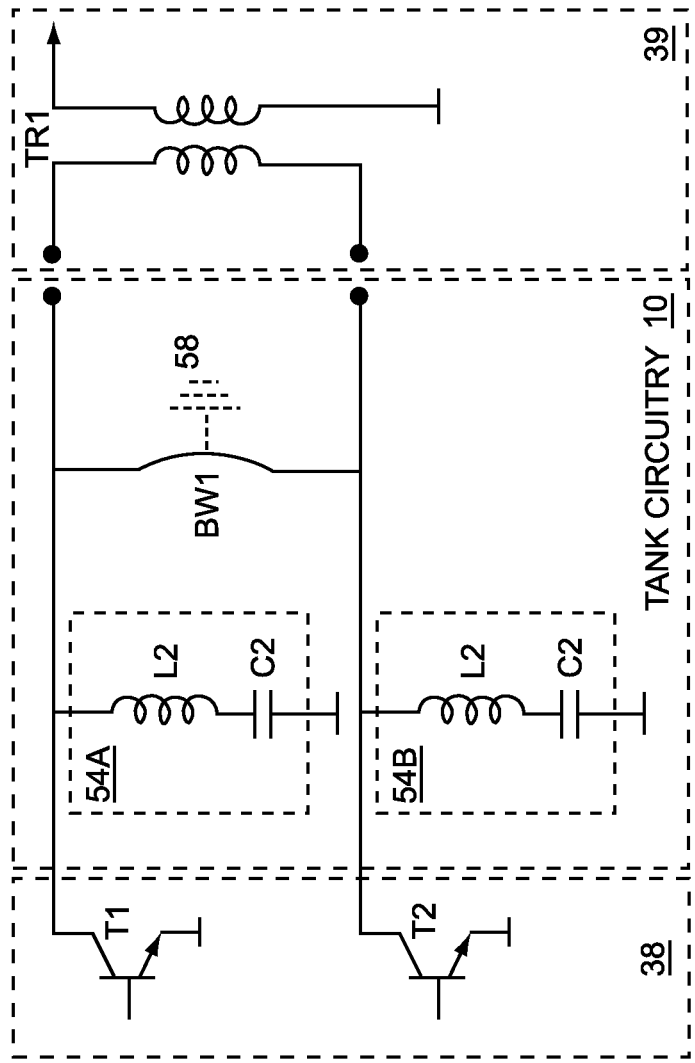
FIG. 6 is a detailed schematic representation of an embodiment of a tank circuit according to the present disclosure.

FIG. 6 shows a detailed schematic representation of an alternative embodiment of the tank circuitry 10 according to one embodiment of the present disclosure. For context, the differential power amplifier circuitry 38 and the output matching network 39 are also shown. According to this embodiment, the tank circuitry 10 may include two or more trap circuits 54, a tank bond wire BW1, and a virtual ground 58. The tank circuitry 10 may be connected to the output terminals of the differential power amplifier circuitry 38. Because the tank bond wire BW1 is connected between the output terminals of the differential power amplifier circuitry 38, the voltage presented at each terminal of the tank bond wire BW1 will be equal but opposite in phase. Accordingly, the voltage at the midpoint of the tank bond wire BW1 will hold steady at zero, resulting in the virtual ground 58 at this point. The half of the tank bond wire BW1 presented before the virtual ground 58 to each output terminal of the differential power amplifier circuitry 38 will perform as an inductor at the fundamental frequency of the differential signal. By designing the tank bond wire BW1 such that the half of the bond wire presented before the virtual ground 58 to each output terminal of the differential power amplifier circuitry 38 resonates with the trap circuit coupled to the same output terminal at the fundamental frequency of the differential signal, a substantially high impedance path is presented to the output terminals of the differential power amplifier circuitry 38 in comparison to the load impedance of the output matching network 39. Accordingly, the loading effects of the trap circuits 54 are reduced, and the impedance of the output matching network 39 does not experience an impedance transformation from the trap circuits 54.

Figure 7:
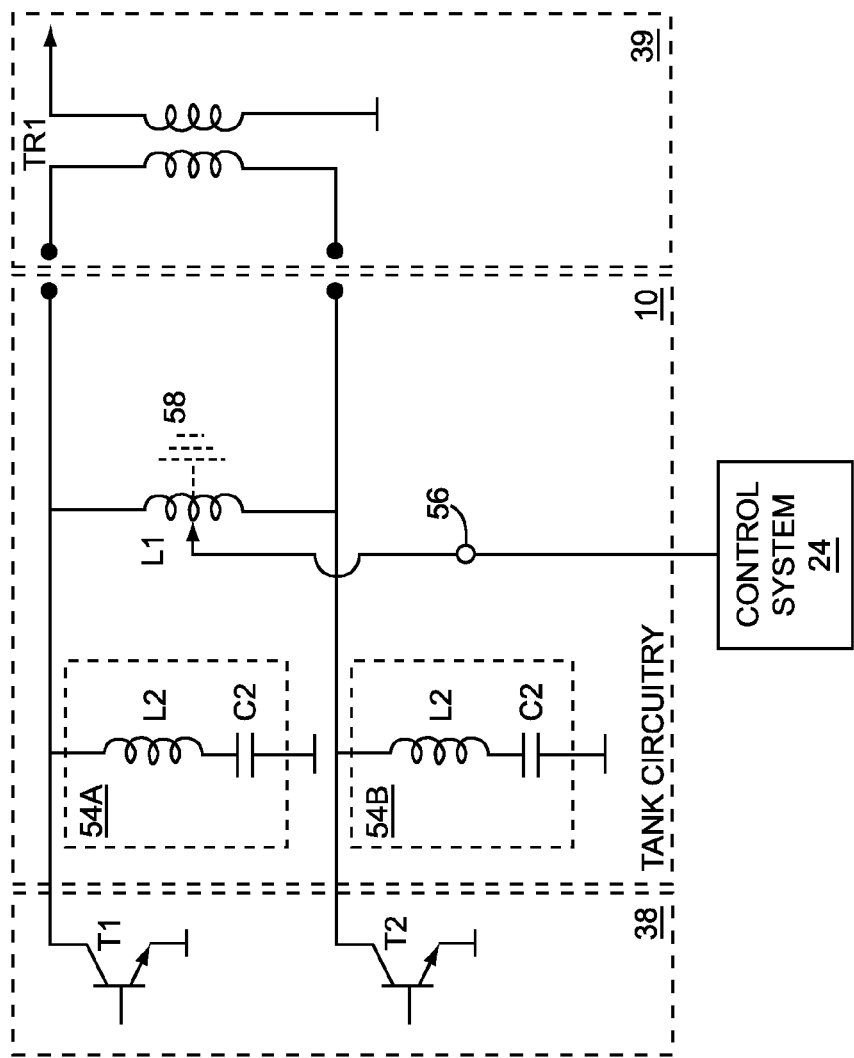
FIG. 7 is a detailed schematic representation of a biasing scheme for a differential power amplifier according to the present disclosure.

FIG. 7 shows a detailed schematic representation of a biasing scheme for a differential power amplifier circuitry 38 according to one embodiment of the present disclosure. Tank circuitry 10 may include two or more trap circuits 54, a tank inductor L1, a bias input terminal 56, and a virtual ground 58. For context, the control system 24, the differential power amplifier circuitry 38, and the output matching network 39 are also illustrated. The tank circuitry 10 may be connected to the output terminals of the differential power amplifier circuitry 38. As discussed above, the virtual ground 58 is realized at the midpoint of the tank inductor L1. According to this embodiment, the bias input terminal 56 is connected at the midpoint of the tank inductor L1 to provide a biasing signal to the differential power amplifier circuitry 38. Due to the virtual ground 58 present at the midpoint of the tank inductor L1, providing a biasing signal at this point will not negatively impact the impedance matching or biasing of the differential power amplifier circuitry 38. According to some embodiments of the present disclosure, the bias input terminal 56 may be in communication with the control system 24. The control system 24 may be configured to provide a biasing signal to the bias input terminal 56 in order to set the operating conditions of the differential power amplifier circuitry 38.

Figure 8:
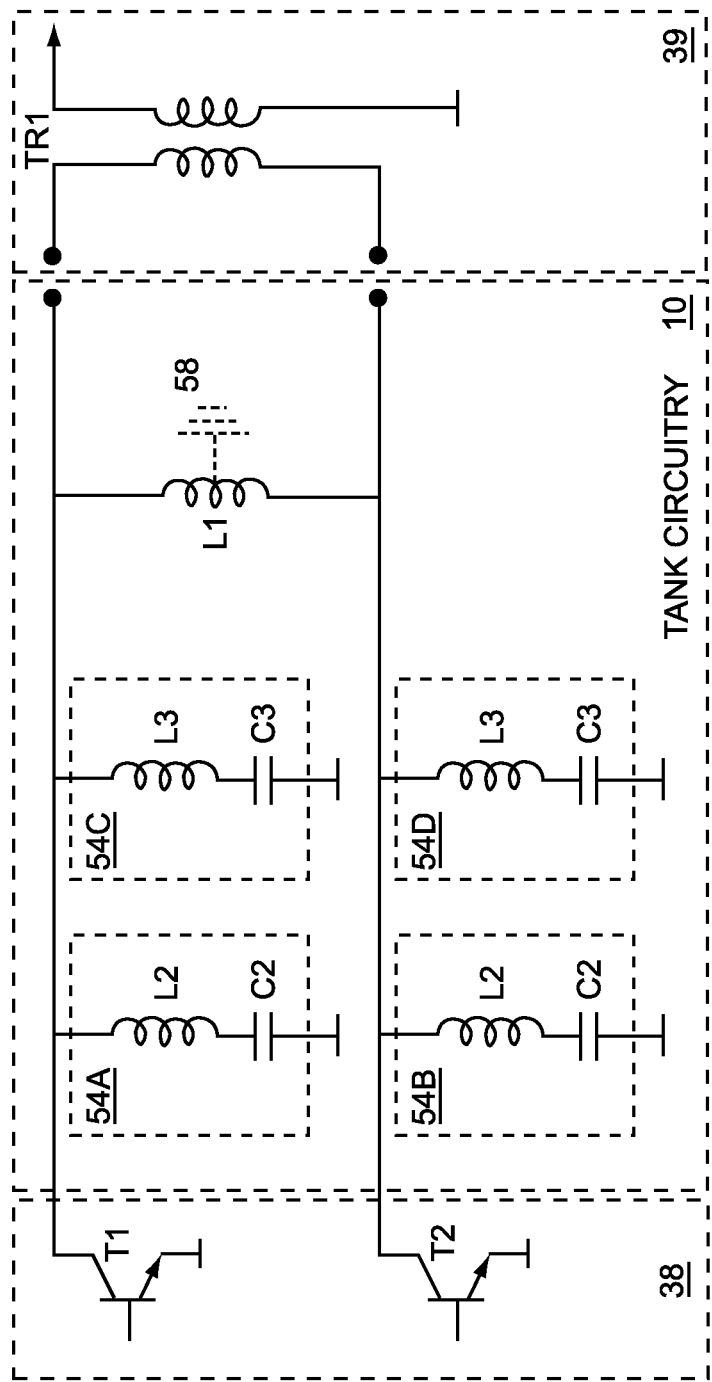
FIG. 8 is a detailed schematic representation of an embodiment of a tank circuit according to the present disclosure.

FIG. 8 shows a detailed schematic representation of an alternative embodiment of the tank circuitry 10 according to one embodiment of the present disclosure. For context, the differential power amplifier circuitry 38 and the output matching network 39 are also shown. According to this embodiment, the tank circuitry 10 may include two or more trap circuits 54, a tank inductor L1 and a virtual ground 58. The tank circuitry 10 may be connected to the output terminals of the differential power amplifier circuitry 38. Notably, FIG. 6 shows four trap circuits 54, with two trap circuits 54 coupled between each output terminal of the differential power amplifier circuitry 38 and ground. Each pair of trap circuits 54 may be configured to resonate at a different harmonic frequency of the differential signal, thereby reducing or eliminating harmonic signals from the differential signal. For example, trap circuits 54A and 54B may be configured to resonate at the second harmonic of the differential signal, while trap circuits 54C and 54D may be configured to resonate at the third harmonic of the differential signal. Accordingly, as discussed above, harmonic signals may be reduced or eliminated from the differential signal.

The tank inductor L1 may be designed such that the half of the inductor presented before the virtual ground 58 to each output terminal of the differential power amplifier circuitry 38 resonates with the trap circuits 54 connected to the same output terminal at the fundamental frequency of the differential signal. When the tank inductor L1 is resonant with the trap circuits 54, both the tank inductor L1 and the trap circuits 54 present a substantially high impedance to the output terminals of the differential power amplifier circuitry 38 compared to the output matching network 39. Accordingly, the loading effects of the trap circuits 54 are reduced, and the impedance of the output matching network 39 does not experience an impedance transformation from the trap circuits 54.

Figure 9:
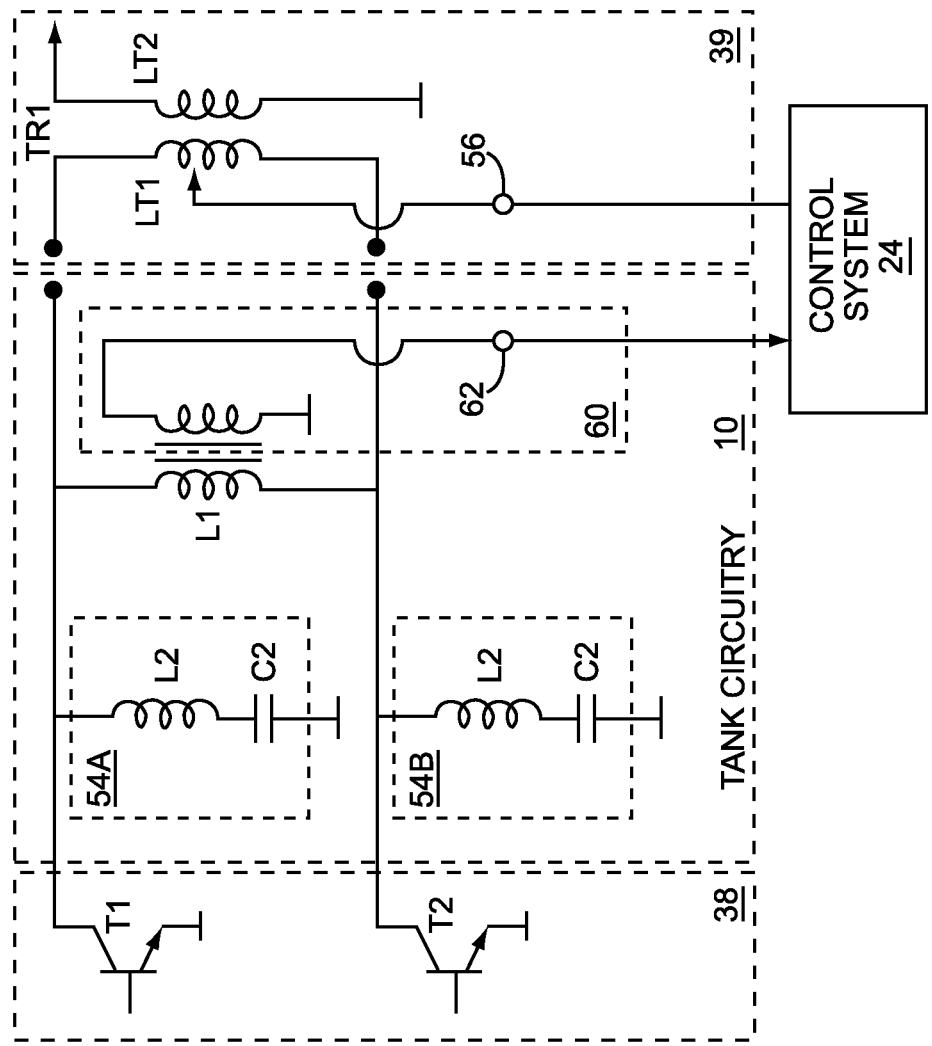
FIG. 9 is a detailed schematic representation of a tank circuit including power detection circuitry according to the present disclosure.

FIG. 9 shows a detailed schematic representation of the tank circuitry 10 including power detection circuitry according to one embodiment of the present disclosure. For context, the control system 24, the differential power amplifier circuitry 38, and the output matching network 39 are also shown. According to this embodiment, the tank circuitry 10 may include two or more trap circuits 54, a tank inductor L1, a bias input terminal 56, and power detection circuitry 60. The tank circuitry 10 may be connected to the output terminals of the differential power amplifier circuitry 38. The power detection circuitry 60 may include a power detection inductor L3 and a power detection output terminal 62. Notably, the power detection inductor L3 is electromagnetically coupled to the tank inductor L1. Accordingly, a proportional amount of the power passed through the tank inductor L1 will be transferred to the power detection inductor L3, which may be placed on the power detection output terminal 62 and used to adjust one or more operating parameters of the differential power amplifier circuitry 38. According to one embodiment of the present disclosure, the power detection output terminal 62 is in communication with the control system 24. The control system 24 may be adapted to receive a measurement from the power detection circuitry 60 and adjust one or more operating parameters of the differential power amplifier circuitry 38 based upon the received measurement. For example, the control system 24 may adjust the biasing signal delivered to the differential power amplifier circuitry 38 through the bias input terminal 56 in response to receiving a measurement from the power detection circuitry 60.

Those skilled in the art will recognize improvements and modifications to the embodiments of the present disclosure. All such improvements and modifications are considered within the scope of the concepts disclosed herein and the claims that follow.

What is claimed is:
1. Tank circuitry comprising:
  first trap circuitry coupled to a first output terminal of a differential power amplifier and second trap circuitry coupled to a second output terminal of the differential power amplifier, wherein each of the first trap circuitry and the second trap circuitry form a substantially low impedance path to ground about one or more harmonic frequencies of a differential signal provided by the differential power amplifier; and a tank inductor coupled between the first output terminal and the second output terminal of the differential power amplifier, wherein the tank inductor, the first trap circuitry, and the second trap circuitry form a substantially high impedance path from each of the first and second output terminals of the differential power amplifier to ground about a fundamental frequency of the differential signal.

2. The tank circuitry of claim 1 wherein the first trap circuitry and the second trap circuitry each comprise a first trap inductor and a first trap capacitor coupled in series and adapted to form a substantially low impedance path to ground about a first harmonic frequency of the differential signal.

3. The tank circuitry of claim 1 further comprising third trap circuitry coupled to the first output terminal of the differential power amplifier and fourth trap circuitry coupled to the second output terminal of the differential power amplifier, wherein each of the third trap circuitry and the fourth trap circuitry form a substantially low impedance path to ground about one or more harmonic frequencies of the differential signal.

4. The tank circuitry of claim 3 wherein the first trap circuitry and the second trap circuitry each comprise a first trap inductor and a first trap capacitor coupled in series and adapted to form a substantially low impedance path to ground about a first harmonic frequency of the differential signal, and further wherein the third trap circuitry and the fourth trap circuitry each comprise a second trap inductor and a second trap capacitor coupled in series and adapted to form a substantially low impedance path to ground about a second harmonic frequency of the differential signal.

5. The tank circuitry of claim 1 wherein the first trap circuitry and the second trap circuitry each comprise a first trap transmission line and a first trap capacitor coupled in series and adapted to form a substantially low impedance path to ground about a first harmonic frequency of the differential signal.

6. The tank circuitry of claim 1 wherein the first trap circuitry and the second trap circuitry each comprise a first trap bond wire and a first trap capacitor coupled in series and adapted to form a substantially low impedance path to ground about a first harmonic frequency of the differential signal.

7. The tank circuitry of claim 1 further comprising an output matching network coupled to each of the first and second output terminals of the differential power amplifier adapted to convert the differential signal into a single-ended output signal.

8. The tank circuitry of claim 7, wherein the output matching network is a transformer.

9. The tank circuitry of claim 8 wherein the transformer comprises a first transforming inductor coupled between each of the first and second output terminals of the differential power amplifier and a second transforming inductor coupled between ground and a single-ended output terminal, wherein the first transforming inductor and the second transforming inductor are electromagnetically coupled.

10. The tank circuitry of claim 9 wherein the tank circuitry further comprises a bias input terminal coupled to the midpoint of the first transforming inductor and adapted to deliver a bias control signal to the differential power amplifier.

11. The tank circuitry of claim 10 further comprising a control system in communication with the bias input terminal adapted to generate the bias control signal for delivery to the differential power amplifier.

12. The tank circuitry of claim 11 further comprising power detection circuitry adapted to detect a power output of the differential power amplifier and in communication with the control system, wherein the control system is adapted to generate the bias control signal based at least in part on a power output measurement received from the power detection circuitry.

13. The tank circuitry of claim 7, wherein the output matching network is a balanced to unbalanced (balun) transformer.

14. The tank circuitry of claim 1 further comprising a bias input terminal coupled to the midpoint of the tank inductor and adapted to deliver a bias control signal to the differential power amplifier.

15. The tank circuitry of claim 14 further comprising a control system in communication with the bias input terminal adapted to generate the bias control signal for delivery to the differential power amplifier.

16. The tank circuitry of claim 1 further comprising power detection circuitry adapted to detect a power output of the differential power amplifier.

17. The tank circuitry of claim 16 wherein the power detection circuitry comprises a power detection inductor electromagnetically coupled with the tank inductor and a power detection output terminal coupled to the power detection inductor adapted to deliver a power output measurement from the power detection inductor.

18. The tank circuitry of claim 17 further comprising a control system in communication with the power detection output terminal adapted to receive the power output measurement from the power detection circuitry.

19. The tank circuitry of claim 18 wherein the control system is adapted to adjust one or more operating parameters of the differential power amplifier based at least in part on the received power output measurement.

20. The tank circuitry of claim 19 further comprising a bias input terminal coupled to the midpoint of the tank inductor and in communication with the control system, wherein the control system is adapted to generate a bias control signal based at least in part on the received power output measurement and deliver the bias control signal to the differential power amplifier through the bias input terminal.

21. Tank circuitry comprising:
first trap circuitry coupled to a first output terminal of a differential power amplifier and second trap circuitry coupled to a second output terminal of the differential power amplifier, wherein each of the first trap circuitry and the second trap circuitry form a substantially low impedance path to ground about one or more harmonic frequencies of a differential signal provided by the differential power amplifier; and a tank transmission line coupled between the first output terminal and the second output terminal of the differential power amplifier, wherein the tank transmission line, the first trap circuitry, and the second trap circuitry form a substantially high impedance path from each output of the differential power amplifier to ground about a fundamental frequency of the differential signal.

22. The tank circuitry of claim 21 wherein the first trap circuitry and the second trap circuitry each comprise a first trap inductor and a first trap capacitor coupled in series and adapted to form a substantially low impedance path to ground about a first harmonic frequency of the differential signal.

23. The tank circuitry of claim 21 further comprising third trap circuitry coupled to the first output terminal of the differential power amplifier and fourth trap circuitry coupled to the second output terminal of the differential power amplifier, wherein each of the third trap circuitry and the fourth trap circuitry form a substantially low impedance path to ground about one or more harmonic frequencies of the differential signal.

24. The tank circuitry of claim 23 wherein the first trap circuitry and the second trap circuitry each comprise a first trap inductor and a first trap capacitor coupled in series and adapted to form a substantially low impedance path to ground about a first harmonic frequency of the differential signal, and further wherein the third trap circuitry and the fourth trap circuitry each comprise a second trap inductor and a second trap capacitor coupled in series and adapted to form a substantially low impedance path to ground about a second harmonic frequency of the differential signal.

25. The tank circuitry of claim 21 wherein the first trap circuitry and the second trap circuitry each comprise a first trap transmission line and a first trap capacitor coupled in series and adapted to form a substantially low impedance path to ground about a first harmonic frequency of the differential signal.

26. The tank circuitry of claim 21 wherein the first trap circuitry and the second trap circuitry each comprise a first trap bond wire and a first trap capacitor coupled in series and adapted to form a substantially low impedance path to ground about a first harmonic frequency of the differential signal.

27. The tank circuitry of claim 21 further comprising an output matching network coupled to each of the first and second output terminals of the differential power amplifier adapted to convert the differential signal provided by the differential power amplifier to a single-ended output signal.

28. The tank circuitry of claim 27 wherein the output matching network is a transformer.

29. The tank circuitry of claim 27 wherein the output matching network is a balanced to unbalanced (balun) transformer.

30. The tank circuitry of claim 28 wherein the transformer comprises a first transforming inductor coupled between the first and second output terminals of the differential power amplifier and a second transforming inductor coupled between ground and a single-ended output terminal, wherein the first transforming inductor and the second transforming inductor are electromagnetically coupled.

31. The tank circuitry of claim 30 further comprising a bias input terminal coupled at the midpoint of the first transforming inductor adapted to deliver a bias control signal to the differential power amplifier.

32. The tank circuitry of claim 31 further comprising a control system in communication with the bias input terminal adapted to generate the bias control signal for delivery to the differential power amplifier.

33. The tank circuitry of claim 32 further comprising power detection circuitry adapted to detect a power output of the differential power amplifier and in communication with the control system, wherein the control system is adapted to generate the bias control signal based at least in part on a power output measurement received from the power detection circuitry.

34. The tank circuitry of claim 21 further comprising a bias input terminal coupled to the midpoint of the tank transmission line adapted to deliver a biasing signal to the differential power amplifier.

35. The tank circuitry of claim 34 further comprising a control system in communication with the bias input terminal adapted to generate a bias control signal for delivery to the differential power amplifier.

36. The tank circuitry of claim 21 further comprising power detection circuitry adapted to detect a power output of the differential power amplifier.

37. The tank circuitry of claim 36 wherein the power detection circuitry comprises a power detection inductor electromagnetically coupled with the tank transmission line and a power detection output terminal coupled to the power detection inductor and adapted to deliver a power output measurement from the power detection inductor.

38. The tank circuitry of claim 36 wherein the power detection circuitry comprises a power detection transmission line electromagnetically coupled with the tank transmission line and a power detection output terminal coupled to the power detection transmission line adapted to deliver a power output measurement from the power detection transmission line.

39. The tank circuitry of claim 37 further comprising a control system in communication with the power detection output terminal and adapted to receive the power output measurement from the power detection circuitry.

40. The tank circuitry of claim 39 wherein the control system is adapted to adjust one or more operating parameters of the differential power amplifier based at least in part on the received power output measurement.

41. The tank circuitry of claim 40 further comprising a bias input terminal coupled to the midpoint of the tank transmission line and in communication with the control system, wherein the control system is adapted to generate a bias control signal based at least in part on the received power output measurement and deliver the bias control signal to the differential power amplifier through the bias input terminal.

42. Tank circuitry comprising:
first trap circuitry coupled to a first output terminal of a differential power amplifier and second trap circuitry coupled to a second output terminal of the differential power amplifier, wherein each of the first trap circuitry and the second trap circuitry form a substantially low impedance path to ground about one or more harmonic frequencies of a differential signal provided by the differential power amplifier; and
a tank bond wire coupled between the first output terminal and the second output terminal of the differential power amplifier, wherein the tank bond wire, the first trap circuitry, and the second trap circuitry form a substantially high impedance path from each of the first and second output terminals of the differential power amplifier to ground about a fundamental frequency of the differential signal.

43. A differential power amplifier comprising:
one or more differential power amplifier stages configured to amplify an input signal and provide a differential output signal; and
tank circuitry coupled to first and second output terminals of the differential power amplifier comprising:
first trap circuitry coupled to a first output terminal of the differential power amplifier and second trap circuitry coupled to a second output terminal of the differential power amplifier, wherein each of the first trap circuitry and the second trap circuitry form a substantially low impedance path to ground about one or more harmonic frequencies of a differential signal provided by the differential power amplifier; and
a tank inductor coupled between the first output terminal and the second output terminal of the differential power amplifier, wherein the tank inductor, the first trap circuitry, and the second trap circuitry form a substantially high impedance path to ground about a fundamental frequency of the differential signal.

44. A radio frequency transmitter comprising:
- a modulator configured to modulate a carrier signal at a desired transmit frequency to produce a modulated carrier signal;
- differential power amplifier circuitry coupled to an output of the modulator and adapted to amplify the modulated carrier signal to a level appropriate for transmission to produce an amplified and modulated carrier signal;
- tank circuitry coupled to first and second output terminals of the differential power amplifier adapted to process the amplified and modulated carrier signal to produce a processed carrier signal, wherein the tank circuitry comprises:
  - first trap circuitry coupled to a first output terminal of the differential power amplifier and second trap circuitry coupled to a second output terminal of the differential power amplifier, wherein each of the first trap circuitry and the second trap circuitry form a substantially low impedance path from each of the first and second output terminals of the differential power amplifier to ground about one or more harmonic frequencies of a differential signal provided by the differential power amplifier;
  - a tank inductor coupled between the first output terminal and the second output terminal of the differential power amplifier, wherein the tank inductor, the first trap circuitry, and the second trap circuitry form a substantially high impedance path to ground about a fundamental frequency of the differential signal; and
- an antenna configured to transmit the processed carrier signal.

* * * * *